United States Patent [19]

Ishii et al.

[11] Patent Number: 4,889,831

[45] Date of Patent: Dec. 26, 1989

[54] METHOD OF FORMING A HIGH TEMPERATURE STABLE OHMIC CONTACT TO A III-V SUBSTRATE

[75] Inventors: Kazuaki Ishii, Atsugi; Toshiro Futatsugi, Isehara; Toshio Oshima, Atsugi; Toshio Fujii, Atsugi; Naoki Yokoyama, Atsugi; Akihiro Shibatomi, Machida, all of Japan

[73] Assignee: Fujitsu Limited, Kawasaki, Japan

[21] Appl. No.: 126,339

[22] Filed: Nov. 30, 1987

[30] Foreign Application Priority Data

May 8, 1987 [JP] Japan .................................. 62-110712

[51] Int. Cl.$^4$ ..................... H01L 21/44; H01L 21/265
[52] U.S. Cl. ................................... 437/184; 437/41; 437/192; 437/133; 437/31; 357/22; 357/16; 357/30; 148/DIG. 10; 148/DIG. 65
[58] Field of Search ............... 437/184, 187, 189, 192, 437/912, 133, 40, 41, 43, 176, 177, 31, 32, 33; 357/22 A, 15, 16, 30 A; 148/DIG. 10, DIG. 11, DIG. 65

[56] References Cited

U.S. PATENT DOCUMENTS

| | | | |
|---|---|---|---|
| 3,984,261 | 10/1976 | Hawrylo | 357/16 |
| 4,075,651 | 2/1978 | James | 357/22 A |
| 4,075,652 | 2/1978 | Umebachi et al. | 357/22 A |
| 4,366,493 | 12/1982 | Braslau et al. | 357/22 A |
| 4,410,903 | 10/1983 | Wieder | 357/22 A |
| 4,468,851 | 9/1984 | Wieder et al. | 357/22 A |
| 4,471,367 | 9/1984 | Chen et al. | 357/15 |
| 4,498,093 | 2/1985 | Allyn et al. | 357/15 |
| 4,568,958 | 2/1986 | Baliga | 357/16 |
| 4,625,225 | 11/1986 | Goodfellow et al. | 357/22 A |
| 4,632,713 | 12/1986 | Tika | 357/15 |
| 4,662,058 | 5/1987 | Cirillo, Jr. et al. | 437/41 |
| 4,672,414 | 6/1987 | Gabriel et al. | 357/16 |
| 4,729,000 | 3/1988 | Abrokwah | 357/16 |
| 4,745,082 | 5/1988 | Kwok | 437/176 |
| 4,745,447 | 5/1988 | Chen et al. | 357/15 |
| 4,764,796 | 8/1988 | Sasaki et al. | 357/22 A |
| 4,794,444 | 12/1988 | Liu et al. | 357/16 |
| 4,801,984 | 1/1989 | Woodall | 357/16 |
| 4,805,005 | 2/1989 | Usagawa et al. | 357/16 |
| 4,825,265 | 4/1989 | Lunardi et al. | 357/16 |

FOREIGN PATENT DOCUMENTS

| | | | |
|---|---|---|---|
| 0206274 | 12/1986 | European Pat. Off. | 357/22 A |
| 0164366 | 8/1985 | Japan | 357/22 A |

OTHER PUBLICATIONS

Ishibashi, "InP MOSFET with $In_{0.53}Ga_{0.47}As/InP$ Heterostructure Contacts", Electronics Letters, Mar. 19, 1981, vol. 17, No. 6, pp. 215–216.

Wang et al., "A 0.1 μm Gate $Al_{0.5}In_{0.5}As/Ga_{0.5}In_{0.5}As$ MODFET Fabricated on GaAs Substrates", IEEE Trans. on Electron Devices, vol. 35, No. 7, Jul. 1988, pp. 818–823.

Ohno et al, "Double Heterostructure $Ga_{0.47}In_{0.53}As$ MESFETs by MBE", IEEE Electron Device Letters, vol. EDL-1, No. 8, Aug. 1980, pp. 154–155.

Hong et al., "Backgating Studies in $In_{0.53}Ga_{0.47}As/In_{0.52}Al_{0.48}As$ Modulation-Doped Field-Effect Transistors," IEEE Trans. on Electron Devices, vol. ED-35, No. 1, Jan. 1988, pp. 8–13.

Woodall et al., "Fermi-Level Pinning by MISFIT Dislocations at GaAs Interfaces", Phys. Rev. Lett., vol. 51, No. 19, Nov. 7, 1983, pp. 1783–1786.

Primary Examiner—Brian E. Hearn
Assistant Examiner—M. Wilczewski
Attorney, Agent, or Firm—Armstrong, Nikaido, Marmelstein, Kubovcik & Murray

[57] ABSTRACT

An electrode structure of an electrode of a refractory metal or a silicide thereof on a layer of $In_xGa_{1-x}As$ ($0<x<1$) on a substrate of a III-V compound semiconductor is ohmic and is stable even at a high temperature, for example, 900° C. This high temperature stable ohmic electrode structure allows ion implantation into the substrate with the electrode as a mask followed by annealing to form a doped region in alignment with the edge of the electrode.

9 Claims, 9 Drawing Sheets

METHOD OF FORMING A HIGH TEMPERATURE STABLE OHMIC CONTACT TO A III-V SUBSTRATE

BACKGROUND OF THE INVENTION

1. Field of the Invention

The present invention relates to a high temperature stable ohmic contact electrode. More specifically, the present invention concerns a method for manufacturing a semiconductor device using a self-alignment process ion implantation with such a high temperature stable ohmic contact electrode and a semiconductor device manufactured by this method, including a bipolar transistor device and a field effect transistor device.

2. Description of the Related Art

An ohmic contact electrode of metal molybdenum to GaAs (a III-V compound semiconductor) through a germanium layer is known, but to make an ohmic contact in this electrode, annealing for reacting the germanium with GaAs is necessary and an alloy layer formed by the annealing cannot be precisely controlled, and thus the problem of nonuniform element characteristics arises.

As an ohmic contact electrode which solves the above problem, there is known an electrode in which tungsten silicide WSi is formed on a GaAs layer through a single crystalline germanium layer. This electrode is ohmic to GaAs without annealing and does not have the problem of the above-mentioned electrode (Japanese Unexamined Patent Publication (Kokai) No. 60-10776).

The electrode described in Japanese Unexamined Patent Publication (Kokai) No. 60-10776 has an advantage in that an ohmic contact is obtainable to GaAs without annealing, but this is not stable at a high temperature and the ohmic characteristic is deteriorated by annealing the ion implanted region for activation after the formation of the electrode. Accordingly, when an ion implanted region is formed in self-alignment with the electrode as a mask, the electrical resistance thereof is increased, which is a problem.

The ohmic contact of this electrode is not stable at a high temperature because, while the ohmic contact to the germanium layer is provided by doping arsenic As at a high concentration, the arsenic, which is highly volatile, is released by the annealing to deteriorate the ohmic contact of the electrode.

SUMMARY OF THE INVENTION

To solve the above problems, the present invention provides a high temperature stable ohmic contact electrode in which a refractory metal or a silicide thereof is formed on a III-V compound semiconductor through an $In_xGa_{1-x}As$ ($0<x<1$) layer.

Thus, according to the present invention, there is provided a process for manufacturing a semiconductor device, comprising the steps of: preparing a substrate of a III-V compound semiconductor; forming a layer of $In_xGa_{1-x}As$ ($0<x<1$) on the substrate, forming an electrode of a refractory metal or a silicide thereof on the $In_xGa_{1-x}As$ layer, the electrode having an edge, the electrode forming an ohmic contact with the $In_xGa_{1-x}As$ layer; patterning the $In_xGa_{1-x}As$ layer in alignment with the edge of the electrode, using the electrode as a mask; locally implanting an ion into a region of the substrate with the electrode as a mask; thereby the thus ion-implanted region of the substrate being in alignment with the edge of the electrode; and heat annealing to activate the ion-implanted region of the substrate.

The III-V compound semiconductor may be GaAs, InP, AlGaAs, InGaAs, InAlP, InAlAs or other semiconductors which may lattice match with an $In_xGa_{1-x}As$ layer, where the lattice match may be made through a graded layer.

The refractory metal includes tungsten, molybdenum, tantalum, etc. A silicide thereof may be also used.

The composition of $In_xGa_{1-x}As$ is that of $0<x<1$, but $0.5<x<1$ is preferable. $In_xGa_{1-x}As$ typically has an n-type conductivity, but may be a p-type, not n-type, if it has the same conductivity as that of an underlying semiconductor layer. An n-type $In_xGa_{1-x}As$ doped with silicon is preferable.

The $In_xGa_{1-x}As$ layer underlying the electrode may be side etched slightly inward from the edge of the electrode.

An insulating film may be formed on the side walls of the electrode and the $In_xGa_{1-x}As$ layer.

There is also provided a semiconductor device comprising: an electrode of a refractory metal or a silicide thereof having an edge; a layer of $In_xGa_{1-x}As$ ($0<x<1$) underlying the electrode, the $In_xGa_{1-x}As$ layer having an edge in alignment with the edge of the electrode, the electrode forming an ohmic contact with the $In_xGa_{1-x}As$ layer; a substrate of a III-V compound semiconductor underlying the $In_xGa_{1-x}As$ layer, the substrate having ohmic contact with the electrode; and an ion-implanted and annealed region in the substrate, the region extending outside of the $In_xGa_{1-x}As$ layer and the electrode and having an edge in alignment with the edge of the electrode.

As an embodiment of the semiconductor device, there is provided a bipolar transistor device comprising: an emitter electrode of a refractory metal or a silicide thereof having an edge; a layer of $In_xGa_{1-x}As$ ($0<x<1$) having a first conductivity type, the $In_xGa_{1-x}As$ layer underlying the emitter electrode and having an edge in alignment with the edge of the emitter electrode, the emitter electrode forming an ohmic contact with the $In_xGa_{1-x}As$ layer; an emitter layer underlying the $In_xGa_{1-x}As$ layer, the emitter layer having the first conductivity type; a base region underlying the emitter layer having a second conductivity type opposite to the first conductivity type; a collector layer underlying the base layer having the first conductivity type; an ion-implanted and annealed region having the second conductivity type and extending from the emitter layer to the base layer and toward the outside the emitter electrode and the $In_xGa_{1-x}As$ layer, the region having an edge in alignment with the edge of the emitter electrode; a base electrode on said ion-implanted and annealed region; and a collector electrode in contact with the collector layer.

In a bipolar transistor device, the positions of an emitter and a collector are interchangeable. Typically an emitter and a base are made to form a heterojunction therebetween in a bipolar transistor of a compound semiconductor.

As another embodiment, there is provided a junction field effect transistor device comprising: a gate electrode of a junction refractory metal or a silicide thereof having an edge; a layer of $In_xGa_{1-x}As$ ($0<x<1$) underlying the gate electrode having an edge in alignment with the edge of the gate electrode, the gate electrode forming an ohmic contact with the $In_xGa_{1-x}As$ layer, the $In_xGa_{1-x}As$ layer having a first conductivity type; a substrate of a III-V compound semiconductor, the $In_xGa_{1-x}As$ layer being on the substrate; a gate region in the substrate, the gate region having the first conductivity type, formed by ion implantation of Be or Mg and annealing before forming the gate electrode and underlying the $In_xGa_{1-x}As$ layer; source and drain ion-implanted regions in the substrate, the source and drain regions having a second conductivity type opposite to the first conductivity type and an edge, the edge of the source and drain regions being in alignment with the edge of the gate electrode and in contact with the gate region.

According to the present invention, an electrode which is ohmic to a III-V compound semiconductor and stable at a high temperature is provided, and as a result, the ohmic contact of the electrode is maintained even if annealing is carried out for activating an ion-implanted impurity-doped region formed in self-alignment with the electrode as a mask, whereby the manufacture of a semiconductor device having such a self alignment structure is made possible.

DESCRIPTION OF THE PREFERRED EMBODIMENT

The present invention is described by way of an example of an HBT, with reference to FIGS. 1A to 1E.

Figure 1A:
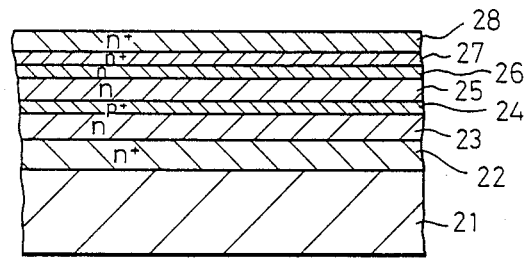
FIGS. 1A to 1E are sectional views of a heterojunction bipolar transistor (HBT) during the main steps of manufacturing the same.

Referring to FIG. 1A, a successive epitaxial growth is made on a semi-insulating GaAs substrate 21 in the order of an $n^+$-type GaAs subcollector layer (dose of $5\times10^{18}$ cm$^{-3}$, thickness of 500 nm) 22, an n-type GaAs collector layer (dose of $5\times10^{17}$ cm$^{-3}$, thickness of 500 nm) 23, a $p^+$-type GaAs base layer (dose of $1\times10^{19}$ cm$^{-3}$, thickness of 100 nm) 24, an n-type AlGaAs emitter layer (dose of $1\times10^{17}$ cm$^{-3}$, thickness of 200 nm) 25, an n-type GaAs layer (dose of $1\times10^{17}$ cm$^{-3}$, thickness of 100 nm) 26, an $n^+$-type GaAs cap layer (dose of $5\times10^{18}$ cm$^{-3}$, thickness of 100 nm) 27, and an $n^+$-type $In_xGa_{1-x}As$ ($0<x<1$) layer (dose of $5\times10^{19}$ cm$^{-3}$, thickness of 100–200 nm) 28. In these layers, the n-type GaAs layer 26 is a layer for decreasing the contact resistance to the n-type AlGaAs layer 25, and the $n^+$-type GaAs layer 20 is a layer for decreasing the contact resistance between the $n^+$-type InGaAs layer 28 and the n-type GaAs layer 25. The $In_xGa_{x-x}As$ layer is formed with a composition of, for example, $In_{0.53}Ga_{0.47}As$. Except fr the $N^+$-type $In_xGa_{1-x}As$ layer 28, these are all epitaxial layers used for a usual HBT (heterojunction bipolar transistor). Although in this example the emitter layer is formed above the base layer, the emitter layer may be formed below the base layer. Moreover, in addition to GaAs, the $In_xGa_{1-x}As$ layer may be applied to an HBT using AlGaAs, InGaAs, InP, InAlP, etc., on which the $In_xGa_{1-x}As$ layer can be grown.

Figure 1B:
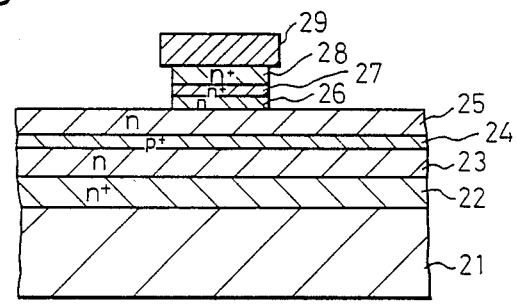

Referring to FIG. 1B, WSi, as an example of a refractory metal or a silicide thereof, is deposited with a thickness of about 400 nm on the $n^+$-type $In_xGa_{1-x}As$ ($0<x<1$) layer 28, and the WSi is patterned by a usual lithograph process to form an emitter electrode 29. The composition of the WSi is preferably $W_5Si_3$.

WSi may be dry etched, for example, by a $CF_4/O_2$ gas, and then the $n^+$-type $In_xGa_{1-x}As$ layer 28, the $n^+$-type GaAs layer 27 and the n-type GaAs layer 26 etched with the patterned emitter electrode 29 as a mask. At this time, the layers 26 to 28 are preferably side-etched slightly (e.g. about 0.2 μm) inward from the edge of the mask (emitter electrode) 29.

Figure 1C:
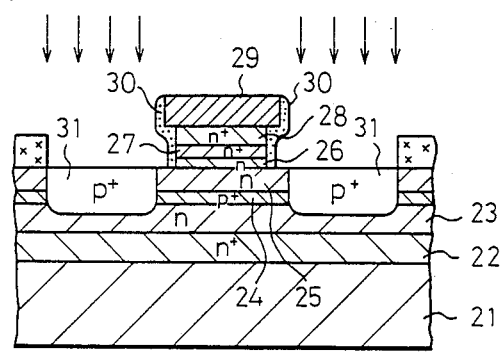

Referring to FIG. 1C, an insulating layer 30 is formed on the side walls of the patterned emitter electrode 29 and layers 26 to 28. The insulating layer 30 may be formed, for example, by depositing silicon dioxide followed by one-directional dry etching. Be, Mg or the like, which becomes a p-type dopant, is then ion-implanted and annealing is conducted for activation to form an outer base region 31. The annealing condition is at a temperature equal to or higher than 650° C. and for a time equal to or longer than 5 seconds. More ideally, in case of Be, the temperature is 650° C. and the time is 5 seconds, and in case of Mg, the temperature is 900° C. is and the time is 5 seconds. At this time, the silicon dioxide 32 as well as the emitter electrode 29 act as a mask, whereby the outer base region 31 is formed in self alignment with the edge of the emitter electrode 29.

Figure 1D:
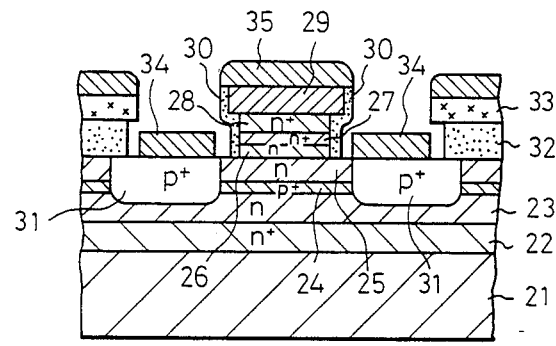

Referring to FIG. 1D, after a silicon dioxide layer 32 and a resist layer 32 are patterned at regions where an emitter electrode and a base electrode are to be formed, a base electrode material such as Cr/Au, Ti/Pt/Au, Au/Zn/Au is deposited in a thickness of about 400 nm, and lift-off is then effected to leave a base electrode 34. If a base electrode material is deposited on the side wall of the emitter electrode 29, etc., and there is a risk of a short circuit between the emitter electrode and the base electrode, the metal on the side wall is removed by declining milling.

Figure 1E:
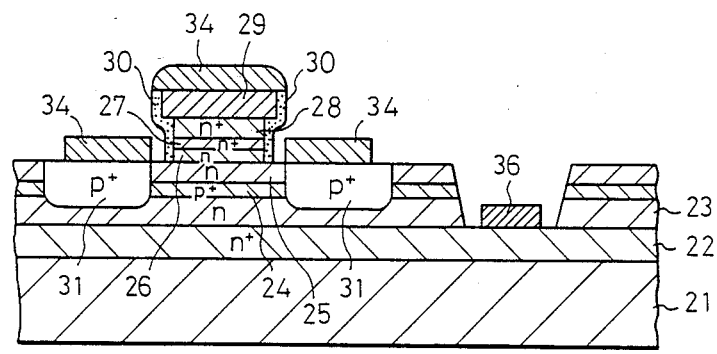

Subsequently, conventional procedures are conducted to realize an HBT. FIG. 1E shows a structure of this HBT. In this figure, the numeral 35 denotes the remaining base electrode-forming material, which has an effect of decreasing the resistance of an emitter electrode. Numeral 36 denotes a collector electrode. The emitter electrode 20 has a good ohmic contact although it has been annealed for forming the outer base region 31.

Note, in the above example, ion implantation into the outer base region 31 may be conducted without forming the insulating layer 30. The base electrode may be formed by a conventional lithograph process without using a self-alignment process with the emitter electrode.

FIG. 2 shows an example in which the present invention is applied to a field effect transistor (FET).

Figure 2A:
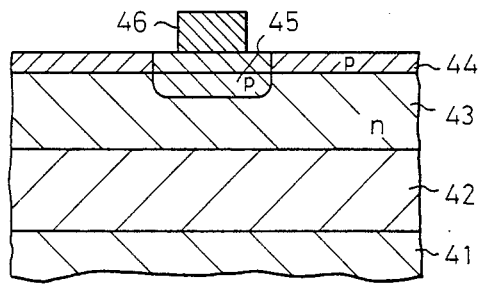
FIGS. 2A to 2C are sectional views of a field effect transistor (FET) during the main steps of manufacturing the same.

Referring to FIG. 2A, a successive epitaxial growth is effected on a GaAs substrate 41 in the order of a non-doped GaAs buffer layer (thickness 500 nm) 42, an n-type GaAs channel layer (dose of $1\times10^{17}$ cm$^{-3}$, thickness of 200 nm) 43, and an p-type $In_xGa_{1-x}As$ ($0<x<1$) layer (beryllium doped, dose of $5\times10^{19}$ cm$^{-3}$, thickness of 100–200 nm) 44. The $In_xGa_{1-x}As$ layer has a composition of, for example, $In_{0.53}Ga_{0.47}As$. Be or Mg is then ion implanted to a region where a channel is to be formed in the n-type GaAs layer 43, followed by annealing to form a p-type gate region 45

($1 \times 10^{18}$ cm$^{-3}$, thickness of 50 nm). WSi is then deposited to a thickness of about 400 nm on the In$_x$Ga$_{1-x}$As layer 44 of the p-type ion-implanted region 45, followed by patterning to form a gate electrode 46. The WSi preferably has a composition of W$_5$Si$_3$.

Figure 2B:
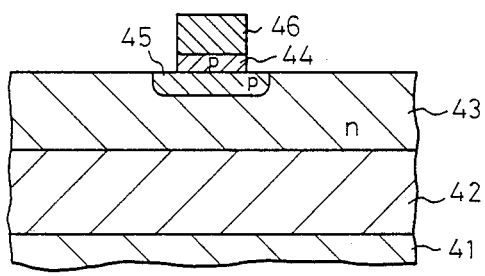

Referring to FIG. 2B, the p-type In$_x$Ga$_{1-x}$As layer is selectively on locally etched with the gate electrode 46 as a mask.

Figure 2C:
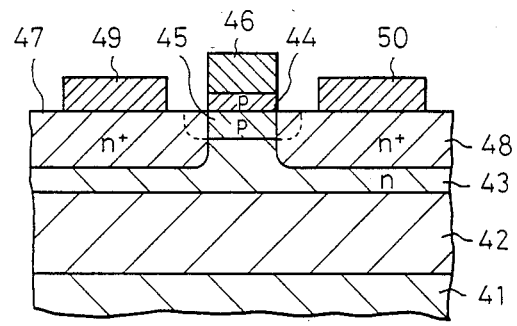

Referring to FIG. 2C, a mask pattern for forming source and drain regions (not shown but may be formed of, for example silicon dioxide) is formed on the n-type GaAs layer 43. By ion implanting, for example, Si ion, an n+-type source region 47 and an n+-type drain region 48 are formed. At this time, the gate electrode 46 acts as a mask for forming the source and drain regions, and the source and drain regions 47 and 48 are formed in self-alignment with the gate electrode 46. The dose to the n+-type source region 47 and the n+-type drain region 48 is $1 \times 10^{14}$ cm$^{-2}$. Then, annealing is effected approximately at 900° C. for 5 seconds to activate the n+-type source and drain regions 47 and 48, and accordingly, the n+-type layer has a dose of about $5 \times 10^{18}$ cm$^{-3}$. Then, a source electrode 49 and a drain electrode 50 are formed with AuGe/Au, etc., and thus an FET is realized. This FET, has an advantage in that the source region 47 and the drain region 48 are formed in self-alignment with the gate electrode 46. The above annealing condition may be at a temperature equal to or higher than 800° C. and for a time equal to or longer than 5 seconds.

Figure 3:
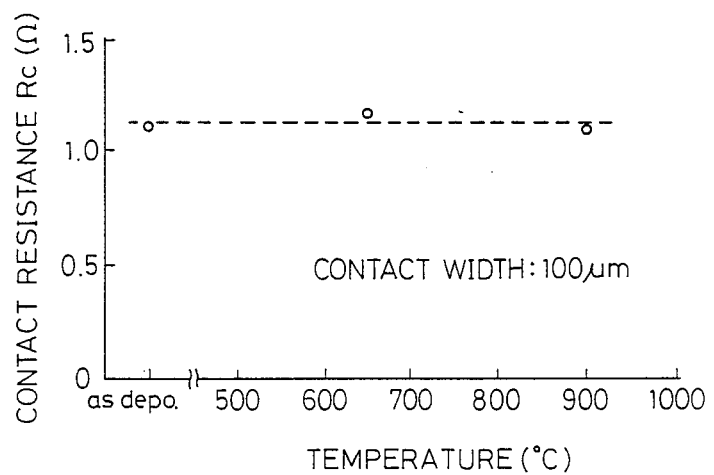
FIG. 3 shows a relationship between the contact resistance of the electrodes according to the present invention and heat treatment temperature measured by TLM.

FIG. 3 shows a result of a measurement of the respective contact resistances of an n-type In$_{0.53}$Ga$_{0.47}$As layer and a W$_5$Si$_3$ layer when heat treatment is effected on these layers after formation on an n-type GaAs layer, as in the above described examples. As seen from the figure, the contact resistances of the In$_{0.53}$Ga$_{0.47}$As and W$_5$Si$_3$ layers are constant even if heat treatment is effected at 900° C.

While the invention has been particularly shown and described in reference to preferred embodiments thereof, it will be understood by those skilled in the art that changes in form and details may be made therein without departing from the spirit and scope of the invention.

We claim:

1. A process for manufacturing a semiconductor device, comprising the steps of:

preparing a substrate of a III-V compound semiconductor having a type of conductivity;

forming a layer of In$_x$Ga$_{1-x}$As on the substrate, wherein the layer has x greater than 0 and less than 1, wherein said layer has a type of conductivity the same as the type of conductivity of the substrate, and wherein the layer forms an ohmic contact with the substrate;

forming an electrode of a refractory metal or a silicide thereof on the In$_x$Ga$_{1-x}$As layer, wherein the electrode has an edge and forms an ohmic contact with the In$_x$Ga$_{1-x}$As layer;

patterning the In$_x$Ga$_{1-x}$As layer in alignment with the edge of the electrode with the electrode as a mask;

locally implanting an ion into a region of the substrate with the electrode as a mask, so as to have the ion-implanted region of the substrate be made in alignment with the edge of the electrode; and heat annealing to activate the ion-implanted region of the substrate.

2. A process according to claim 1, further comprising a step of forming a buffer layer between the substrate and the In$_x$Ga$_{1-x}$As layer to match the lattices therebetween.

3. A process according to claim 1, wherein the III-V compound semiconductor is selected from the group consisting of GaAs, InP, AlGaAs, InGaAs, InAlP and InAlAs.

4. A process according to claim 1, wherein x of the In$_x$Ga$_{1-x}$As is a value between 0.5 and 1.0.

5. A process according to claim 4, wherein x of the In$_x$Ga$_{1-x}$As is 0.53.

6. A process according to claim 1, wherein the refractory metal is selected from the group of tungsten, molybdenum and tantalum.

7. A process according to claim 1, wherein the In$_x$Ga$_{1-x}$As layer is side etched slightly inward from the edge of the electrode.

8. A process according to claim 1, further comprising a step of forming an insulating film on the side walls of the electrode and the In$_x$Ga$_{1-x}$As layer after patterning thereof.

9. A process according to claim 1, wherein the heat annealing step is performed at a temperature equal to or more than 650° C.

* * * * *